United States Patent
Kovac et al.

(10) Patent No.: US 11,777,498 B2
(45) Date of Patent: *Oct. 3, 2023

(54) HIGH POWER RF SWITCH WITH CONTROLLED WELL VOLTAGE FOR IMPROVED LINEARITY

(71) Applicant: pSemi Corporation, San Diego, CA (US)

(72) Inventors: David Kovac, Arlington Heights, IL (US); Joseph Golat, Crystal Lake, IL (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/698,998

(22) Filed: Mar. 18, 2022

(65) Prior Publication Data

US 2022/0278682 A1   Sep. 1, 2022

Related U.S. Application Data

(63) Continuation of application No. 17/129,568, filed on Dec. 21, 2020, now Pat. No. 11,290,105.

(51) Int. Cl.
*H03F 1/02* (2006.01)
*H03F 3/04* (2006.01)
*H03K 17/687* (2006.01)
*H03K 17/693* (2006.01)

(52) U.S. Cl.
CPC ... *H03K 17/693* (2013.01); *H03K 2217/0018* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 8,368,463 B2* | 2/2013 | Homol | H04B 1/40 330/296 |
| 10,236,872 B1* | 3/2019 | Willard | H03K 17/693 |
| 2017/0237424 A1* | 8/2017 | Wilz | H03K 19/018507 327/384 |

* cited by examiner

*Primary Examiner* — Kenneth B Wells
(74) *Attorney, Agent, or Firm* — Steinfl + Bruno LLP

(57) ABSTRACT

RF transistors manufactured using a bulk CMOS process exhibit non-linear drain-body and source-body capacitances which degrade the linearity performance of the RF circuits implementing such transistors. The disclosed methods and devices address this issue and provide solutions based on implementing two or more bias voltages in accordance with the states of the transistors. Various exemplary RF circuits benefiting from the described methods and devices are also presented.

15 Claims, 9 Drawing Sheets

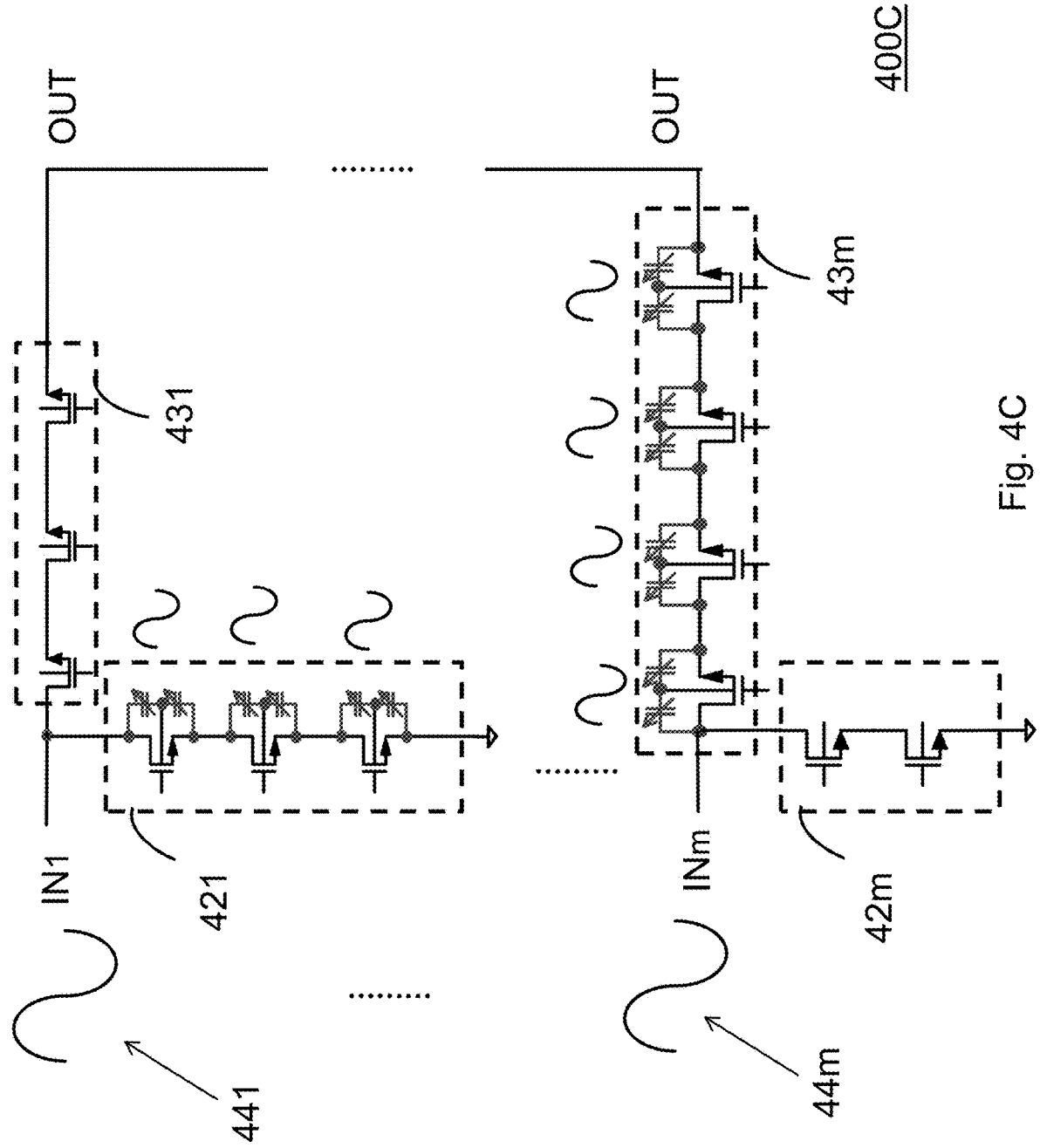

HIGH POWER RF SWITCH WITH CONTROLLED WELL VOLTAGE FOR IMPROVED LINEARITY

CROSS-REFERENCE TO RELATED APPLICATIONS

The present application is a continuation of U.S. patent application Ser. No. 17/129,568, filed Dec. 21, 2020, titled "High Power RF Switch With Controlled Well Voltage For Improved Linearity," now U.S. Pat. No. 11,290,105 issued Mar. 29, 2022, which is herein incorporated by reference in its entirety.

FIELD

The present disclosure is related to methods and apparatus using controlled well voltages for improved linearity in RF circuits, more in particular in RF circuits including high power RF switches in a bulk CMOS process.

BACKGROUND

High power radio frequency (RF) switches with high linearity are generally manufactured in silicon-on-insulator (SOI) processes by implementing floating body devices. As known in the art, because of the reduction of drain-body or source-body capacitances, floating body metal-oxide-semiconductor field effect transistors (MOSFETs) provide a better overall linearity compared, for example, with a bulk CMOS process. This is particularly important during operative conditions, when some switches are in an OFF state in which presence of undesired junction capacitances can degrade the overall linearity of the circuit. At the same time, a bulk CMOS process provides cost advantages and is highly scalable. It is therefore desirable to be able to manufacture high linearity switches in a bulk CMOS process to benefit from a better cost-performance tradeoff.

FIG. 1A shows a prior art transistor built in accordance with an SOI process. Device capacitances between terminals of the transistors, i.e. gate-source, gate-drain, and drain-source capacitances (Cgs, Cgd, Cds) are also shown by way of schematic capacitors. FIG. 1B on the other hand, shows the same device manufactured according to a bulk CMOS process where, in addition to the mentioned gate-source and gate-drain device capacitances, variable drain-body, variable source-body, and gate-body capacitances (Cdb, Csb, Cgb) are also present. FIG. 1C shows a top view layout of the transistor of FIG. 1B.

FIG. 2A shows a cross section of a prior art N-channel field effect transistor (NFET) device built with triple-well bulk CMOS process. FIG. 2B shows the electrical model of the NFET shown in FIG. 2A. As shown in FIGS. 2A-2B, the drain-body and source-body junctions are represented through respective drain-body and source-body diodes (Ddb, Dsb) having non-linear capacitances which degrade linearity when the NFET device is modulated with an RF signal.

In view of the above, solutions are therefore needed to reduce the undesired effect of the junction capacitances of devices manufactured using a bulk CMOS process.

SUMMARY

The disclosed methods and devices provide practical solutions to the above-mentioned problem.

According to a first aspect, a controllable field effect transistor (FET) for use in a radio frequency (RF) switch is disclosed, the FET comprising gate, source, drain, body, substrate and a well configured to receive a well bias voltage, wherein: the well is of an opposite semiconductor polarity to the body and the substrate of the FET; the well is disposed in a region separate from the body and from the substrate of the FET; the FET is fabricated with a bulk complementary metal-oxide-semiconductor (CMOS) process and is configured to: receive a gate bias voltage switchable between a first gate bias voltage level and a second gate bias voltage level to put the FET in an ON or OFF state respectively, receive a body bias voltage switchable between a first body bias voltage level in correspondence with the ON state, and a second body bias voltage level in correspondence with the OFF state, and receive a well bias voltage switchable between a first well bias voltage level in correspondence with the ON state, and a second well bias voltage level in correspondence with the OFF state.

According to a second aspect, a method of biasing a radio frequency (RF) field effect transistor (FET) switch manufactured using a bulk CMOS process is disclosed, the method comprising: in an ON state of the FET switch: applying a first gate voltage to a gate terminal of the FET switch, applying a first body voltage to a body terminal of the FET switch, and applying a first well voltage to a well terminal of the FET switch; in an OFF state of the FET switch: applying a second gate voltage different from the first gate voltage to the gate terminal of the FET switch; applying a second body voltage different from the first body voltage to the body terminal of the FET switch, and applying a second well voltage different from the first well voltage to the well terminal of the FET switch.

Further aspects of the disclosure are provided in the description, drawings and claims of the present application.

DESCRIPTION OF THE DRAWINGS

FIGS. 4A-4C show exemplary RF switches adopting the teachings of the present disclosure.

DETAILED DESCRIPTION

Throughout the present disclosure, the term "stress voltages" in a FET refers to the time-dependent dielectric breakdown voltage of the gate, and the gate oxide rupture voltage.

Figure 1A:
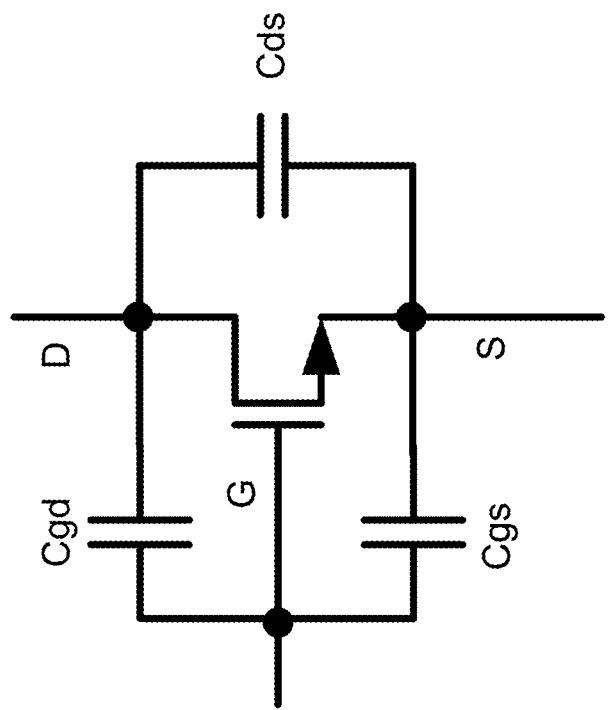
FIG. 1A shows a prior art transistor built with a SOI process.
Figure 1C:
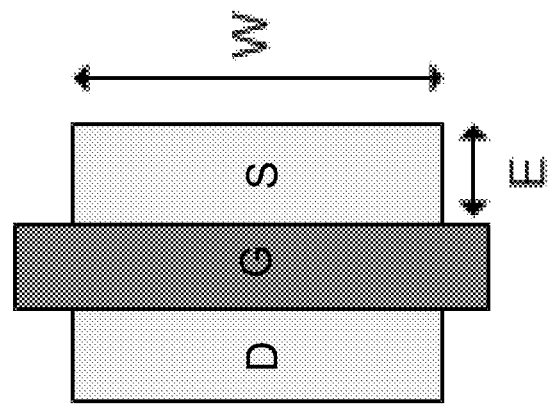
FIG. 1C shows the layout of the prior art transistor of FIG. 1B
Figure 1B:
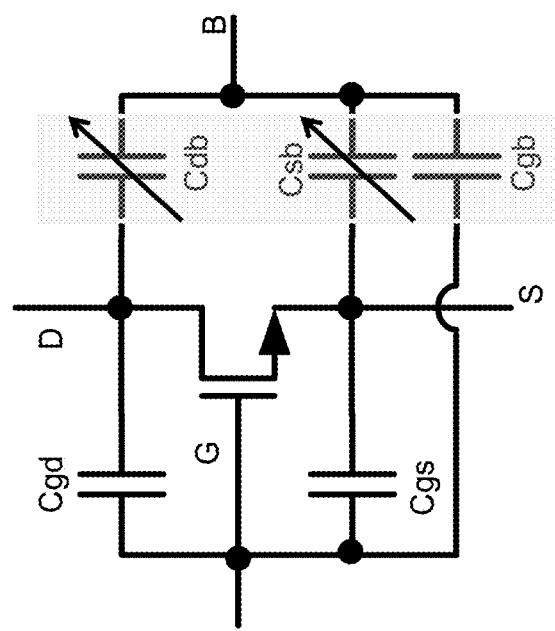
FIG. 1B shows a prior art transistor built with a bulk CMOS process.

Referring back to FIG. 1B, junction capacitances can generally be calculated using the following formula:

$$C_j = \frac{C_{jo}}{(1 + V_r/\phi_b)^m} \quad (1)$$

wherein $V_r$ is the absolute value of the reverse voltage (defined as the voltage to keep the junction in a reverse biased condition, also known as reverse bias) across the junction, $\varnothing_b$ is the built-in potential of the junction and m is a number typically within the range of 0.3 to 0.4. FIG. 1C shows the layout of the NFET of FIG. 1B, wherein the width of the device is indicated with (W) and the width of the source (S) and drain (D) is indicated with (EThe drain-body and source-body capacitances (Cdb, Csb) can now be calculated as:

$$C_{db} = C_{sb} = W*E*C_j + 2*(W+E)*C_{jsw} \quad (2)$$

wherein $C_j$ is the bottom plate junction capacitance and $C_{jsw}$ is the junction sidewall capacitance. Looking at equations (1) and (2), the inventors have observed that one way to reduce the junction capacitances in a bulk CMOS process is to increase the reverse bias across such junctions. As will be explained more in detail below, the disclosed methods and devices leverage such observation to provide a better cost performance tradeoff when manufacturing RF circuits based on the bulk CMOS process.

Figure 3:
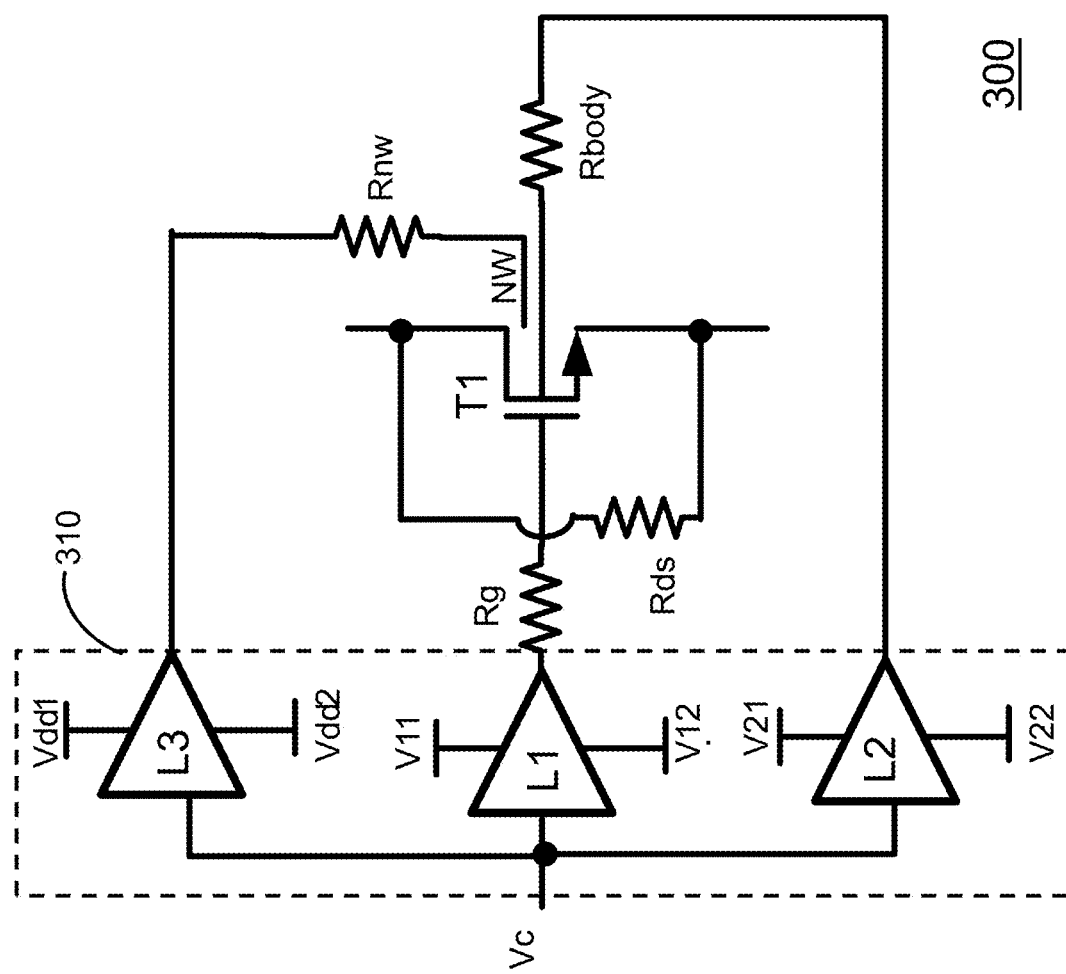
FIG. 3 shows an exemplary circuit (300) according to the teachings of the present disclosure.

FIG. 3 shows a circuit (300) in accordance with the teachings of the present disclosure showing biasing control of a device during operation to mitigate the undesired impact of non-linear junction capacitances. Circuit (300) comprises a transistor (T1) (e.g. an NFET), and a control circuit (310) receiving control signal (Vc) and including level shifters (L1, L2, L3). Each of level shifters (L1, L2) may be configured to have DC supply voltages (V11, V12), and (V21 V22). Level shifter (L3) may operate with DC bias voltages (Vdd1, Vdd2), i.e. the biasing of the N-well (NW) of transistor (T1) can be switched between such DC bias voltages. Level shifter (L1) is coupled to the gate terminal of transistor (T1) through gate resistor (Rg), while level shifter (L2) is coupled to the body terminal of transistor (T1) via body resistor (Rbody). The source terminal of transistor (T1) may be shorted to ground (not shown in the figure) in a shunt configuration and drain-source resistor (Rds) connects the drain and source terminals together. According to the teachings of the present disclosure, the source and drain terminals may have a path to ground such that their DC voltages are at ground potential.

With continued reference to FIG. 3 according to embodiments of the present disclosure, when transistor (T1) is enabled, the gate and body voltages of transistor (T1) are set to voltages (V11, V21), respectively. As a result, a voltage difference of V=V11-V21 will appear across the gate-body terminals of transistor (T1). On the other hand, when transistor (T1) is disabled, its gate voltage is set to voltage (V12) and its body voltage is set to (V22). In some embodiments, the source terminal may be grounded (not shown in FIG. 3) and also coupled to the drain terminal of transistor (T1), both of the source and drain terminals will be sitting at 0V. As a result, when transistor (T1) is disabled, i.e. the drain-body and the source-body junctions are reverse-biased and will have a voltage equal to DC voltage (V22).

Figure 2A:
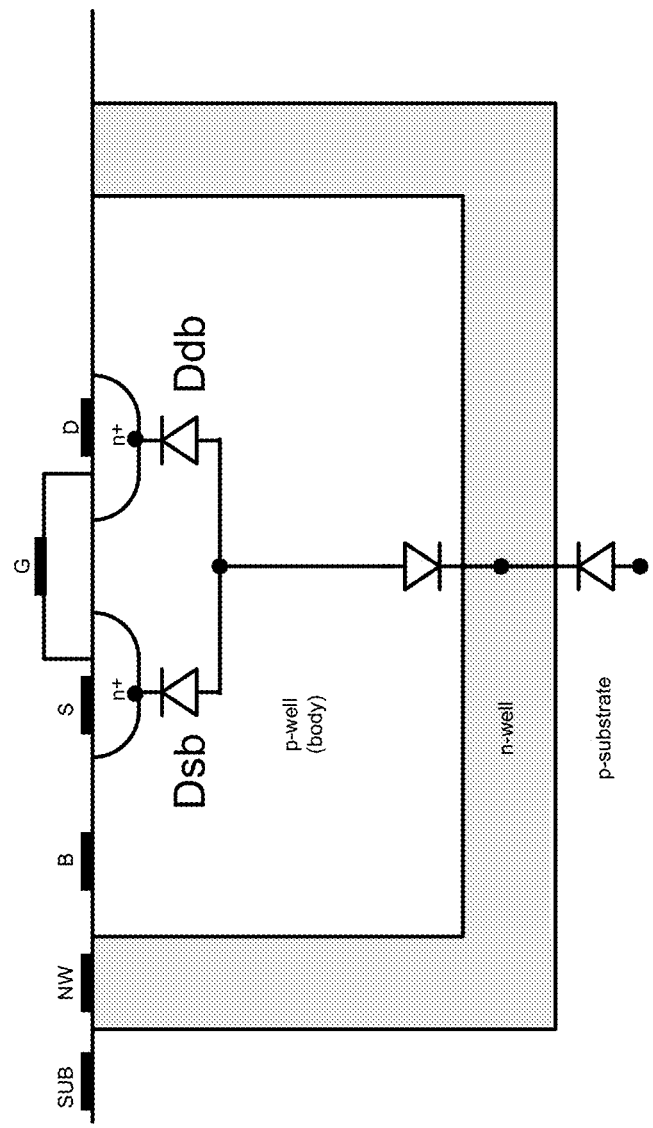
FIG. 2A shows a schematic cross section of a prior art NFET device built with a bulk CMOS process.
Figure 2B:
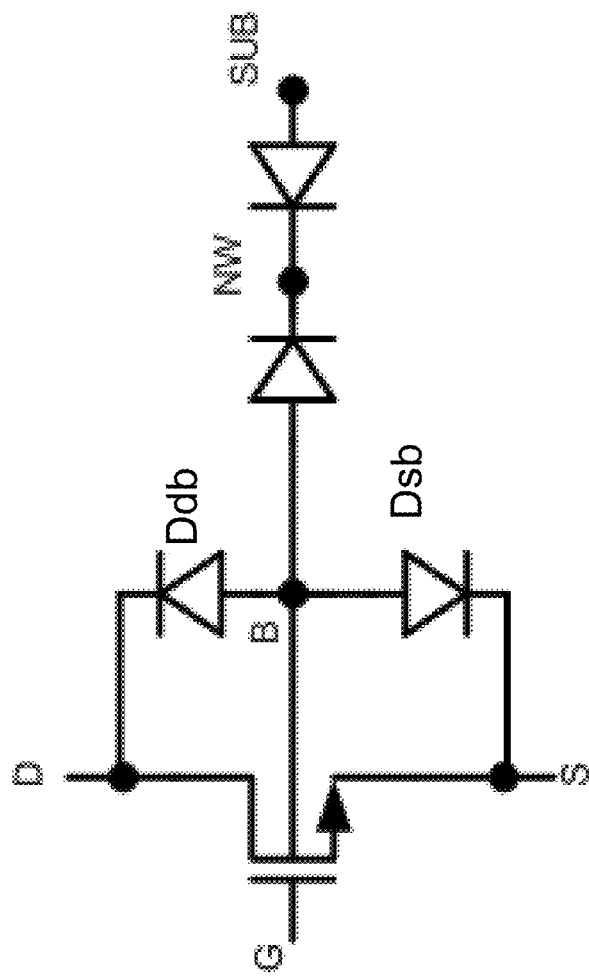
FIG. 2B shows an equivalent electrical model of the NFET shown in FIG. 2A.

In accordance with the teachings of the present disclosure, DC voltages (V11, V12, V21, V22) may be chosen such that in the disabled state, there is a reverse bias across the drain-body and the source-body junctions of transistor (T1), without causing breakdown of the drain-body and source-body junctions when in the disabled state and without overstressing the gate-body region of transistor (T1) when in the enabled state. Moreover, DC voltage (Vdd2) may be smaller than DC voltage (Vdd1). According to the teachings of the present disclosure, in the disabled mode, the reverse bias voltages across source-body and drain-body (Vsb and Vdb) are maximized while maintaining Vgb<Vtddb and Vgb<Vox-rupture in enabled mode. Vgb, Vtddb, and Vox-rupture represent the gate-body voltage, the time-dependent dielectric breakdown voltage of the gate, and the gate oxide rupture voltage, respectively. When the transistor (T1) is in OFF state, DC voltage (Vdd2) is applied to the N-well (NW) of transistor (T1). DC voltage (Vdd2) may be chosen such that when transistor (T1) is in the OFF state, the voltage across the N-well-body junction stays within a tolerable range to reduce possible overstressing of such a junction during this state. When transistor (T1) is in the ON state, DC voltage (Vdd1) is applied to the N-well of transistor (T1). The person skilled in the art will understand that switching of the N-well can improve linearity, consistently with the discussion above. Additionally, if the body bias and the well bias are switched at the same time and by the same amount, the body-to-well voltage will not change, with the consequence that there is no charging or discharging current of the body to N-well junction capacitance and associated time constants. The same techniques may be used for a PMOS device. In such case, the polarities of the bias signals and the doping of regions shown in FIG. 2A may be reversed.

For the sake of added clarification, an exemplary case is considered where DC voltages (V11, V12, V21, V22) are chosen as V11=+3.4V, V12=−3V, V21=0V and V22=−3V. In this case, when transistor (T1) is ON, the gate voltage is 3.4V and the body voltage is 0V, resulting in a typically tolerable voltage of 3.4V across the gate-body region. On the other hand, when the transistor is OFF, Vd=Vs=0V and Vb=−3V, so a reverse voltage of −3V appears across the drain-body and source-body junctions to ensure a smaller junction capacitance (see also eqs. (1) and (2)), and therefore an improved overall linearity performance of the circuit. This is made possible by virtue of applying proper level shifted bias voltages to various terminals of transistor (T1) during the ON and OFF states, thus reducing the negative impacts of drain-body and source-body capacitances on the overall linearity performance of the circuit, as described previously. On the other hand, the gate-body region of transistor (T1) is at V12-V22=0V voltage during the OFF state. An additional exemplary case is now considered where the switch device is biased in an ON state with the gate at 3.4 V and the body at −3 V, while the drain and source DC voltages are 0 V. The device will be in the triode region and a channel will form. The gate to channel voltage will be 3.4 V and the channel to body voltage will be −3 V, which would generally be acceptable for a CMOS device with these gate bias conditions. However, if the body is held at −3 V continuously, there may be transient conditions where the gate and body bias voltages are applied but the channel has not yet formed. This would result in 3.4−(−3)=6.4 V across the gate oxide, which would likely be an overstress condition for the oxide. In other words, the four voltages (V11, V12, V21, V22) are selected to attain the combined goal of 1) increasing the reverse bias voltage of the drain-body and source-body junctions above the minimum or threshold reverse bias voltage and below breakdown voltage in the OFF state of transistor (T1) and 2) maintaining the voltage across the gate-body junction below set stress voltages in the ON state of transistor (T1), these stress voltages being Vtddb and Vox-rupture as defined previously. In other words, and to reiterate, in the disabled mode, the reverse bias voltages across source-body and drain-body (Vsb and Vdb) are maximized while maintaining Vgb<Vtddb and Vgb<Vox-rupture in the enabled mode.

In what follows, some exemplary circuits that can benefit from the above-disclosed teachings are presented.

Figure 4A:
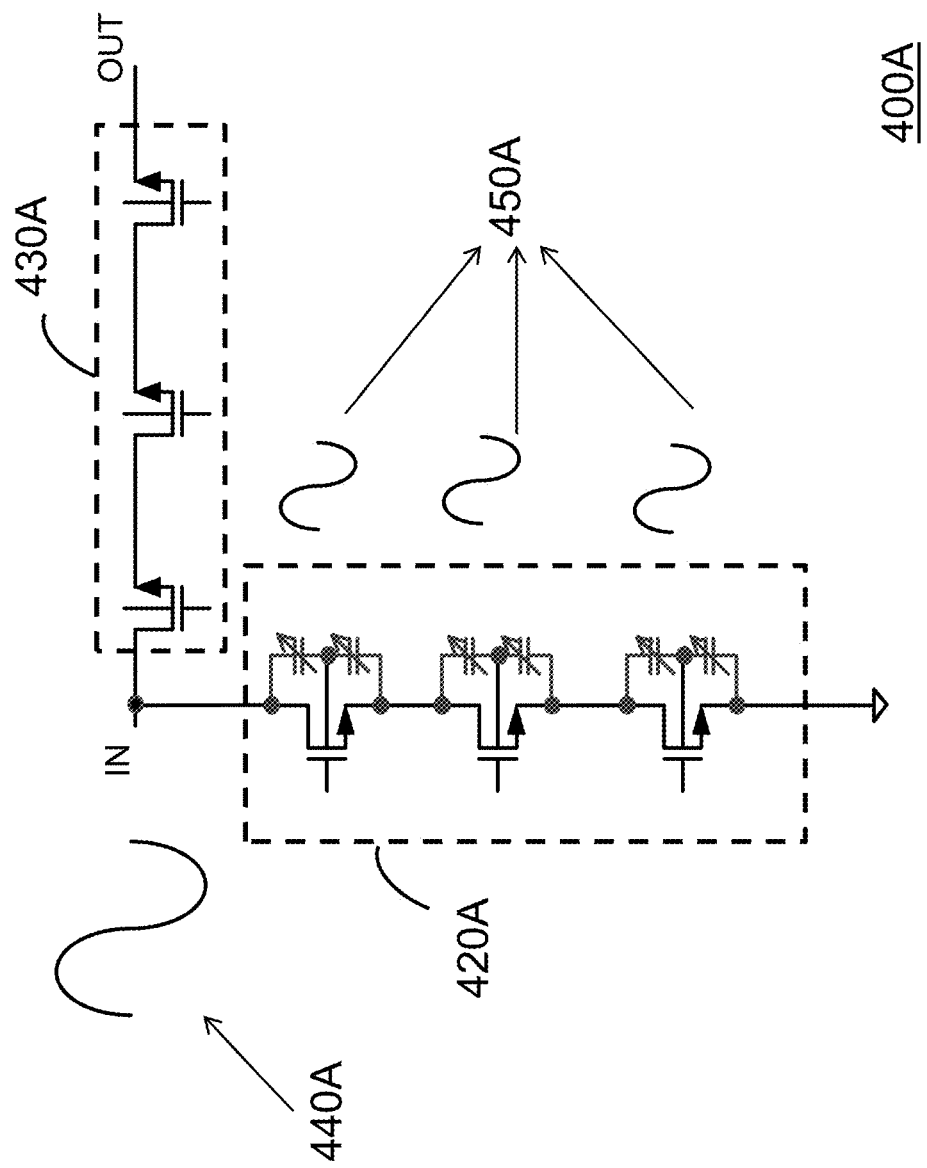

FIG. 4A shows an exemplary RF switch (400A) comprising a shunt FET stack (420A) and a series FET stack (430A). Each FET stack may include a plurality of transistors, e.g. three, as shown in the figure. When the RF switch (400A) is in the ON state, the transistors within series FET stack (430A) are ON and input signal (440A) is passed from input port (IN) to output port (OUT). In addition, all the transistors within shunt FET stack (420A) are OFF. As a result, input RF signal (440A) is distributed across non-linear drain-body and source-body capacitances of the transistors in shunt FET stack (420A), as shown by signals (450A). Due to the presence of non-linear capacitances across the drain-body and source-body terminals of the transistors (420A), the presence of such distributed signals (450A) may result in an undesired distortion thus degrading the overall linearity performance of switch (400A).

Figure 4B:
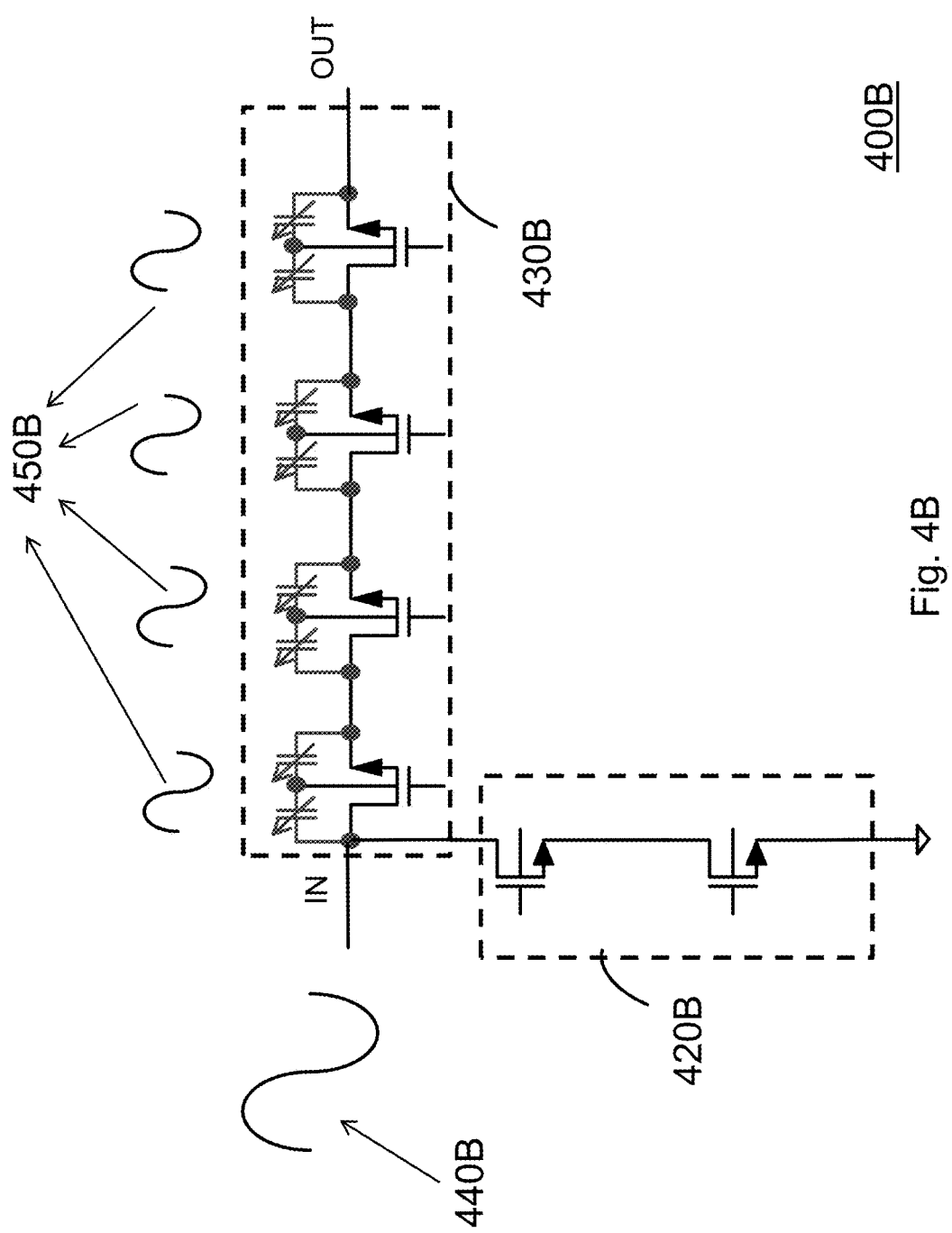

FIG. 4B shows a further exemplary RF switch (400B) including a shunt FET stack (420B) and a series FET stack (430B). Each FET stack may include a plurality of transistors. When the RF switch (400B) is in an OFF state, the transistors within series FET stack (430B) are OFF, thus decoupling input port (IN) from output port (OUT). As a result, input RF signal (440B) is distributed across non-linear drain-body and source-body capacitances of the transistors in series FET stack (430B), as shown by signals (450B).

FIG. 4C shows yet another exemplary RF switch (400C) including a plurality of shunt FET stacks (421, . . . , 42m) and a plurality of series FET stacks (431, . . . , 43m). Each of the mentioned FET stacks may include a plurality of transistors. RF switch (400C) further includes a plurality of input ports (IN1, . . . , INm) and output port (OUT). As an example, in order to connect input port (IN1) to output port (OUT), series FET stack (431) is turned ON and the rest of series stacks are turned OFF to isolate their corresponding input ports from output port (OUT). Additionally, shunt FET stack (421) is turned OFF and the rest of shunt FET stacks are ON to short their corresponding input signals to ground, thereby providing a better isolation of all input ports other than input port (IN1) from output port (OUT). As a result of such configuration, similarly to what was previously described with regards to switch (400A) of FIG. 4A, input RF signal (441) is distributed across non-linear drain-body and source-body capacitances of the transistors in shunt FET stack (421). This results in undesired distortion thus degrading the overall linearity performance of switch (400C). Those skilled in the art will understand that these switches are bi-directional and thus assignment of inputs and outputs can be swapped.

The person skilled in the art will also understand that the RF switches shown in FIGS. 4A-4C are exemplary switches demonstrating some of the applications that could benefit from the teachings of the present disclosure. The teachings presently disclosed can also apply to any other RF switches and/or circuits implementing devices that are built through a bulk CMOS process and requiring a solution to non-linear capacitance problems as described above.

Figure 5:
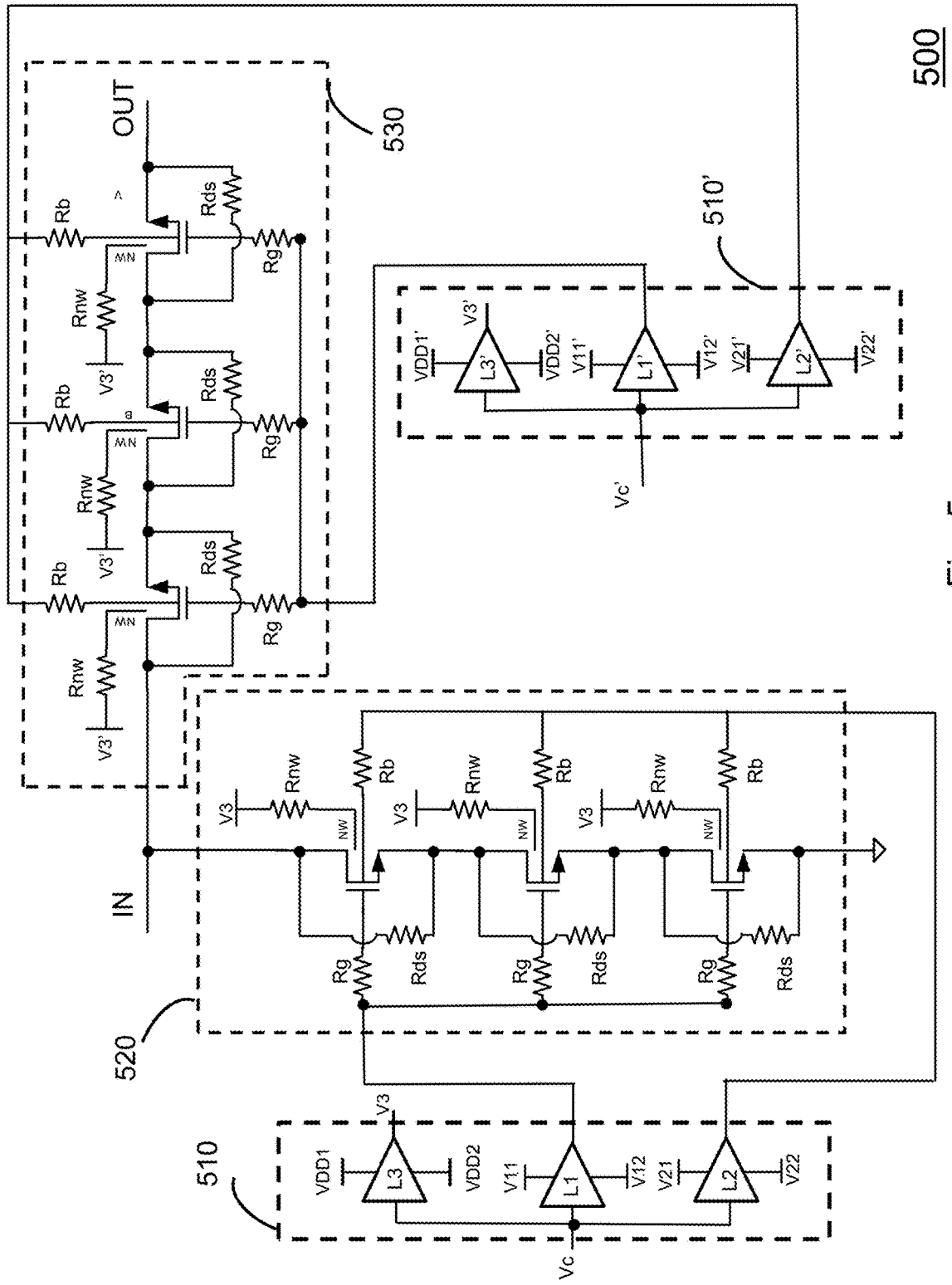
FIG. 5 shows an exemplary RF switch according to an embodiment of the present disclosure.

In order to overcome the problem shown in FIGS. 4A-4C, FIG. 5 shows an RF switch (500) in accordance with embodiments of the present disclosure. RF switch (500) comprises a shunt FET stack (520) and a series FET stack (530). Each FET stack may include a plurality of transistors. RF switch (500) further comprises control circuits (510, 510') receiving control signals (Vc, Vc'). Control circuit (510) comprises level shifters (L1, L2, L3). Each of level shifters (L1, L2) may be configured to provide DC voltages (V11, V12), and (V21, V22) at their respective outputs. Level shifter (L3) may be configured to provide DC voltages (VDD1, VDD2) at level shifter (L3) output (V3). With reference to FIG. 5, all the nodes with labels V3 are coupled to the output of level shifter (L3). Control circuit (510') comprises level shifters (L1', L2', L3'). Each of level shifters (L1', L2') may be configured to provide DC voltages (V11', V12'), and (V21' V22,') at their respective outputs. Level shifter (L3') may be configured to provide DC voltages (VDD1', VDD2') at level shifter (L3') output (V3'). With continued reference to FIG. 5, within shunt FET stack (520), each shunt gate resistor (Rg) is connected to the gate terminal of a corresponding shunt transistor at one end, and to the output of level shifter (L1) at the other end. Additionally, each shunt body resistor (Rb) is connected to the body terminal of a corresponding shunt transistor at one end, and to the output of level shifter (L2) at another end. Moreover, each shunt N-well resistor (Rnw) is connected to an N-well of a corresponding shunt transistor at one end and to level shifter (L3) output (V3) at another end. Similarly, within series FET stack (530), each series gate resistor (Rg) is connected to the gate terminal of a corresponding series transistor at one end, and to the output of level shifter (L1') at the other end. Additionally, each series body resistor (Rb) is connected to the body terminal of a corresponding series transistor at one end, and to the output of level shifter (L2') at another end. Moreover, each series N-well resistor (Rnw) is connected to an N-well of a corresponding series transistor at one end and to level shifter (L3') output (V3') at another end.

With combined reference to FIGS. 3 and 5, the teachings with regards to transistor (T1) of FIG. 3 and the way such transistor is biased using control circuit (310) apply to each of the transistors within the shunt stack (520) and their interaction with control circuit (510). The same applies to each of the transistors within the series stack (530) and their interaction with control circuit (510'). As an example, if a transistor within the shunt FET stack (520) is considered, DC voltages (V11, V12, V21, V22, VDD1, VDD2) feeding level shifters (L1, L2, L3) are chosen such that:

when the transistor is in an OFF state, the gate voltage, the body voltage and the well voltage of the transistor are selected to apply a high enough reverse voltage (e.g. −3V) across drain-body, source-body and well-body junctions of the transistor while maintaining the transistor in the OFF state, to minimize the non-linear capacitances of such junctions and improve the overall linearity of the circuit; and when the transistor in an ON state, the gate voltage and the body voltage of the transistor are selected to apply a tolerable DC voltage (e.g. around 3.5V) across the gate-body junction of the same transistor in order to avoid overstressing of such a transistor.

The same applies to each of the transistors within the series FET stack (530) and their corresponding level shifters (L1', L2', L3') and DC voltages (V11', V12', V21', V22', VDD1, VDD2).

With continued reference to FIG. 5, in accordance with various embodiments of the present disclosure:

each of the DC voltages (V11, V12, V21, V22, VDD1, VDD2) may be equal or different from their (V11', V12', V21', V22', VDD1', VDD2') counterparts. As an example, in the same circuit, V11 may be equal to V11', V21 may be different from V21', and VDD1 may be different from VDD1', each resistor shown with a label, may have a resistance equal to or different from another resistor shown with the same label. For example, the gate resistor (Rg) of a transistor within the shunt FET stack (520) may have a resistance which may be equal to or different from the resistance of another gate resistor within the same shunt series stack (520) or within the series FET stack (530), any of the shunt FET stack (520) and series FET stack (530) may include one or more transistors, the number of transistors in the shunt FET stack (520) may be equal to or different from the number of transistors within the series FET stack (530).

With further reference to FIG. 5, the person skilled in the art will understand that the teachings disclosed with reference to the exemplary circuit (500) will also apply to any multiple-pole multiple throw switch with an arbitrary number of shunt FET stacks and series FET stacks, each FET stack including an arbitrary number of stacked transistors.

With reference to FIGS. 3 and 5, according to the teachings of the present disclosure, control circuits (310, 510, 510') in conjunction with their corresponding shunt or series switches, may be implemented as a part of an integrated circuit which can also be part of a module and/or a communication system or device.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

The invention claimed is:

1. A radio frequency (RF) switch comprising a field effect transistor (FET), the FET comprising a first well and a second well, wherein:
the second well is of an opposite semiconductor polarity to the first well and a substrate of the FET;
the FET is fabricated with a bulk complementary metal-oxide-semiconductor (CMOS) process and is configured to
  i) receive a gate bias voltage switchable between a gate first bias voltage level and a gate second bias voltage level to put the FET in an ON or OFF state, respectively; and
  ii) receive a first well bias voltage switchable between a first well first bias voltage level in correspondence with the ON state, and a first well second bias voltage level in correspondence with the OFF state;
  iii) receive a second well bias voltage switchable between a second well first bias voltage level in correspondence with the ON state, and a second well second bias voltage level in correspondence with the OFF state, and
a first well bias voltage difference between the first well first bias voltage level and the first well second bias voltage level is the same as a second well bias voltage difference between the second well first bias voltage level and the second well second bias voltage level;
when transitioning from one state to another, the first and the second well bias voltages are configured to switch at the same time, and
the gate second bias voltage is negative with respect to ground.

2. The RF switch of claim 1, further configured to:
receive a first well bias voltage switchable between a first well first bias voltage level in correspondence with the ON state, and a first well second bias voltage level in correspondence with the OFF state, and
receive a second well bias voltage switchable between a second well first bias voltage level in correspondence with the ON state, and a second well second bias voltage level in correspondence with the OFF state; and
wherein a second body bias voltage level is negative with respect to ground.

3. The RF switch of claim 2, wherein the FET comprises a first well to second well junction, reverse biased in a steady state condition.

4. The RF switch of claim 3, wherein the FET is an NMOSFET, the first well is p-type, the second well is n-type and the substrate is p-type.

5. A circuital arrangement comprising the RF switch of claim 2 and a control circuit configured to provide the second well bias voltage.

6. A circuital arrangement comprising:
the RF switch of claim 3; and a control circuit configured to provide the gate bias voltage, the first well bias voltage and the second well bias voltage to the FET.

7. The circuital arrangement of claim 6, wherein the control circuit comprises a plurality of level shifters configured to provide respective DC gate, first well and second well bias voltages to the FET.

8. The circuital arrangement of claim 7, wherein the plurality of level shifters comprise three level shifters.

9. The circuital arrangement of claim 8, further comprising series gate, first well and second well resistors between the FET and respective level shifters of the plurality of level shifters.

10. An electronic module comprising the RF switch of claim 1.

11. A communication device comprising the RF switch of claim 1.

12. The RF switch of claim 1, wherein
the first gate bias voltage level is +3.4 V and the second gate bias voltage level is −3 V,
the first well first bias voltage level is 0 V and the first well second bias voltage level is −3 V.

13. The RF switch of claim 1, wherein the first gate bias voltage level, the second gate bias voltage level, the first well first bias voltage level and the first well second bias voltage level are configured to be selected to
  i) maintain a voltage across the drain-first well and source-first well junctions of the FET below a diode forward voltage and below a breakdown voltage in the OFF state of the FET; and
  ii) maintain voltage across a gate-first well junction of the FET in the ON state of the FET below a gate breakdown voltage and a gate oxide rupture voltage of the FET.

14. A method of biasing a radio frequency (RF) switch comprising a field effect transistor (FET) switch, the FET switch manufactured using a bulk CMOS process, the method comprising:
in an ON state of the FET switch:
  applying a first level shifted gate voltage to a gate terminal of the FET switch,
  applying a first level shifted first well voltage to a first well terminal of the FET switch, and
  applying a first level shifted second well voltage to a second well terminal of the FET switch;
in an OFF state of the FET switch:
  applying a second level shifted gate voltage different from the first gate voltage to the gate terminal of the FET switch;
  applying a second level shifted first well voltage different from the first well voltage to the first well terminal of the FET switch, and
  applying, at the same time of the second level shifted first well voltage, a second level shifted well voltage different from the first well voltage to the second well terminal of the FET switch,
  wherein the second level shifted gate voltage and the second level shifted first well voltage are both negative with respect to ground, and wherein a first well voltage difference between the first level shifted first well voltage and the second level shifted first well voltage is the same as a second well voltage difference between the first level shifted second well voltage and the second level shifted second well voltage.

15. The method of claim 14, wherein the first level shifted gate voltage, the second level shifted gate voltage, the first level shifted first well voltage and the second level shifted first well voltage are selected to
  i) maintain a voltage across the drain-first well and source-first well junctions of the FET switch below a diode forward voltage and below a breakdown voltage in the OFF state of the FET switch; and
  ii) maintain voltage across a gate-first well junction of the FET switch in the ON state of the FET switch below a gate breakdown voltage and a gate oxide rupture voltage of the FET switch.

\* \* \* \* \*